United States Patent
Vigna et al.

(10) Patent No.: US 6,184,052 B1
(45) Date of Patent: Feb. 6, 2001

(54) PROCESS FOR MANUFACTURING HIGH-SENSITIVITY CAPACITIVE AND RESONANT INTEGRATED SENSORS, PARTICULARLY ACCELEROMETERS AND GYROSCOPES, AND SENSORS MADE THEREFROM

(75) Inventors: Benedetto Vigna, Potenza; Paolo Ferrari, Gallarate; Marco Ferrera, Domodossola; Pietro Montanini, Melegnano, all of (IT)

(73) Assignee: STMicroelectronics, S.r.l., Agrate Brianza (IT)

( * ) Notice: Under 35 U.S.C. 154(b), the term of this patent shall be extended for 0 days.

(21) Appl. No.: 09/428,863

(22) Filed: Oct. 26, 1999

Related U.S. Application Data

(62) Division of application No. 09/113,979, filed on Jul. 10, 1998.

(30) Foreign Application Priority Data

Jul. 10, 1997 (EP) .................................................. 97830345

(51) Int. Cl.[7] .................................................. H01L 21/00
(52) U.S. Cl. .................. 438/51; 438/52; 438/53; 438/739
(58) Field of Search .................. 438/50–53, 412, 438/739

(56) References Cited

U.S. PATENT DOCUMENTS

| | | | |
|---|---|---|---|
| 5,072,288 | 12/1991 | MacDonald et al. | 357/68 |
| 5,363,375 | 11/1994 | MacDonald et al. | 156/643 |
| 5,399,415 | 3/1995 | Chen et al. | 428/209 |
| 5,514,622 | 5/1996 | Bornstein et al. | 438/628 |
| 5,747,353 | * 5/1998 | Bashir et al. | 438/50 |
| 5,846,849 | 12/1998 | Shaw et al. | 438/52 |

FOREIGN PATENT DOCUMENTS

| | | |
|---|---|---|
| 0 714 121 A2 | 5/1996 | (EP) . |
| 364020670 | 1/1989 | (JP) . |
| 404192370 | 7/1992 | (JP) . |

OTHER PUBLICATIONS

Gabrielson, Thomas B., Mechanical–Thermal Noise in Micromachined Acoustic and Vibration Sensors, *IEEE Transactions On Electron Devices*, vol. 40, No. 5, May 1993, pp. 903–909.

Kuehnel, Wolfgang et al., "A Surface Micromachined Silicon Accelerometer With On–Chip Detection Circuitry," *Sensors And Actuators*, A 45, (1994) pp. 7–16.

\* cited by examiner

*Primary Examiner*—Charles Bowers
*Assistant Examiner*—Hsien-Ming Lee
(74) *Attorney, Agent, or Firm*—Theodore E. Galanthay; Robert Iannucci; Seed IP Law Group, PLLC

(57) ABSTRACT

A sensor having high sensitivity is formed using a suspended structure with a high-density tungsten core. To manufacture it, a sacrificial layer of silicon oxide, a polycrystal silicon layer, a tungsten layer and a silicon carbide layer are deposited in succession over a single crystal silicon body. The suspended structure is defined by selectively removing the silicon carbide, tungsten and polycrystal silicon layers. Then spacers of silicon carbide are formed which cover the uncovered ends of the tungsten layer, and the sacrificial layer is then removed.

9 Claims, 3 Drawing Sheets

PROCESS FOR MANUFACTURING HIGH-SENSITIVITY CAPACITIVE AND RESONANT INTEGRATED SENSORS, PARTICULARLY ACCELEROMETERS AND GYROSCOPES, AND SENSORS MADE THEREFROM

CROSS-REFERENCE TO RELATED APPLICATION

This application is a divisional of pending U.S. patent application Ser. No. 09/113,979, filed Jul. 10, 1998.

TECHNICAL FIELD

The invention relates to a process for manufacturing high-sensitivity integrated sensors, particularly accelerometers and gyroscopes, and related sensors.

BACKGROUND OF THE INVENTION

As is known, the use of electromechanical microstructures of semiconductor material, the manufacture of which utilizes microelectronics techniques, has recently been proposed for producing accelerometers and gyroscopes. These silicon micro-processing techniques make it possible to manufacture different types of angular velocity and acceleration sensors. In particular, at the present time prototypes operating according to the piezoelectric, piezoresistive, capacitive, threshold, resonant and tunnel effect principle of operation have been proposed.

Historically, integrated micro-structures have been manufactured by preferably using the bulk micromachining technique in which a wafer of single-crystal silicon is processed on both faces. This technique is, however, incompatible with the process phases for forming components of the circuit which processes the signal picked up by the sensitive element.

It has therefore been proposed to use the technique of surface micromachining in which the sensitive element is made of polycrystal silicon and suspended structures are formed by depositing and successively removing sacrificial layers. This technique is compatible with the current integrated circuit manufacturing processes and is therefore preferred at present. The integrated micro-structures formed with this technique are, however, relatively insensitive to acceleration and angular velocity. In fact, having a mass of the order of a few tenths of a microgram, they suffer the effects of thermodynamic noise caused by the Brownian movement of the particles of the fluid in which they are immersed (see, for example, the article by T. B. Gabrielson entitled "Mechanical-Thermal Noise in Micromachined Acoustic and Vibration Sensors", IEEE Transactions on Electron Devices, vol. 40, No. 5, May 1993). The upper limit to the mass obtainable with these structures is imposed by genuinely technological reasons; the deposition of very thick films involves extremely long wafer processing times and renders the surface of the wafer unsuitable for the successive operations such as the lapping of the wafers.

SUMMARY OF THE INVENTION

In one embodiment, the invention provides a manufacturing process to form a sensor according to surface micromachining which remedies the disadvantages of the known technique.

An embodiment of the invention provides a process for manufacturing high-sensitivity capacitive including forming a temporary support, a suspended structure that contains tungsten, and then removing the temporary support. Another embodiment includes resonant integrated sensors, particularly accelerometers and gyroscopes, comprising a suspended structure coupled to a semiconductor body wherein the suspended structure includes tungsten.

BRIEF DESCRIPTION OF THE DRAWINGS

For an understanding of the invention a preferred embodiment thereof will now be described, purely by way of non-exhaustive example, with reference to the accompanying drawings.

DETAILED DESCRIPTION OF THE INVENTION

Reference will be made below to a sensor of differential capacitive type, i.e., one in which acceleration induces the movement of a seismic mass which constitutes the electrode common to two capacitors, electrically connected, thereby varying the two capacitances in opposite directions (differential variation of capacitance). The process provided by the invention can therefore also be used to manufacture an absolute capacitive sensor or a sensor of the resonant type.

An embodiment of a capacitive-type accelerometric or gyroscopic sensor according to this process will now be described with reference to the accompanying drawings in which the thicknesses of the various layers of material are not to scale and some layers are not shown in all the drawings for reasons of representation.

Figure 1:
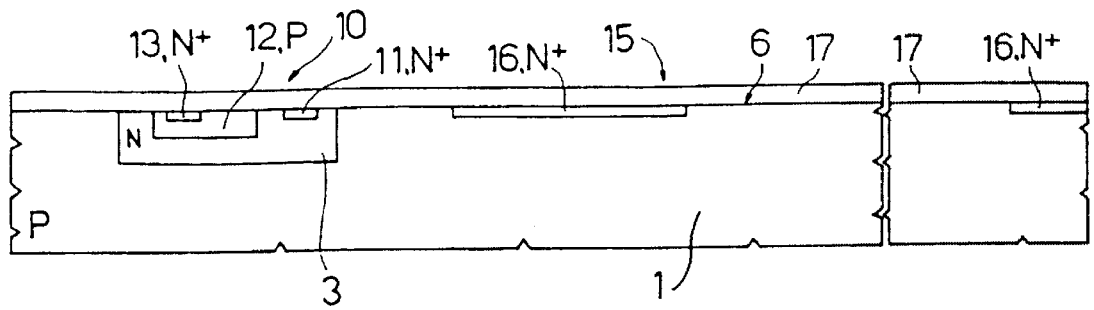
FIGS. 1–10 show transverse sections through a wafer of semiconductor material in different zones of a capacitive accelerometric sensor, during different steps of the manufacturing process according to the invention.

The manufacturing process initially comprises standard steps for the manufacture of integrated circuits. In particular, in the example shown, starting with a wafer 1 of P-type single-crystal silicon comprising N-type pockets 3, the components of the circuitry are formed. Of these, FIG. 1 shows an NPN transistor 10 having an $N^+$-type collector contact region 11, a P-type base region 12 and an $N^+$-type emitter region 13. Furthermore, in a zone 15 of the wafer 1 intended to support the seismic mass (also called sensor zone 15 below). $N^+$-type connection or "runner" regions 16, facing a surface 6 of the wafer 1 for the electrical connection of the seismic mass, are formed at the same time as the regions 11 and 13.

A dielectric layer 17 for the opening of the contacts, such as BPSG (Boron Phosphorus Silicon Glass), is then deposited on the surface 6 of the wafer, obtaining the intermediate structure of FIG. 1. Then, by means of a suitable mask and selective removal step, part of the dielectric layer 17 is removed from the sensor zone 15, obtaining the structure of FIG. 2.

A silicon oxide layer 18 which, in the sensor zone 15, extends directly on the surface 6 of the wafer 1, is then deposited at low temperature. A silicon nitride layer 19 is then deposited at low pressure by means of CVD (Chemical Vapour Deposition), obtaining the structure of FIG. 3.

Figure 2:
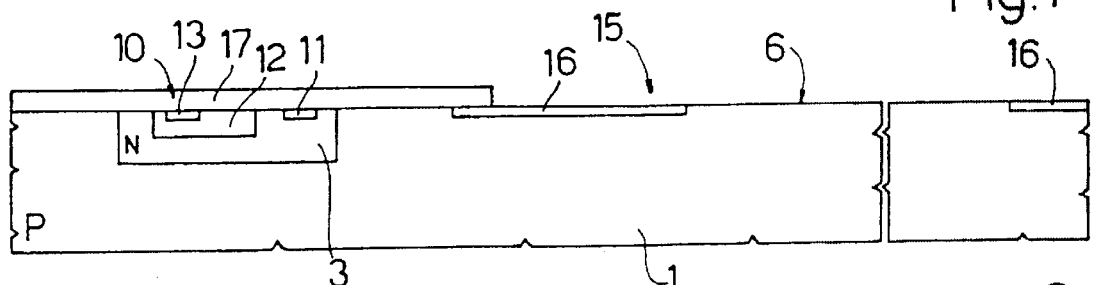
Figure 3:
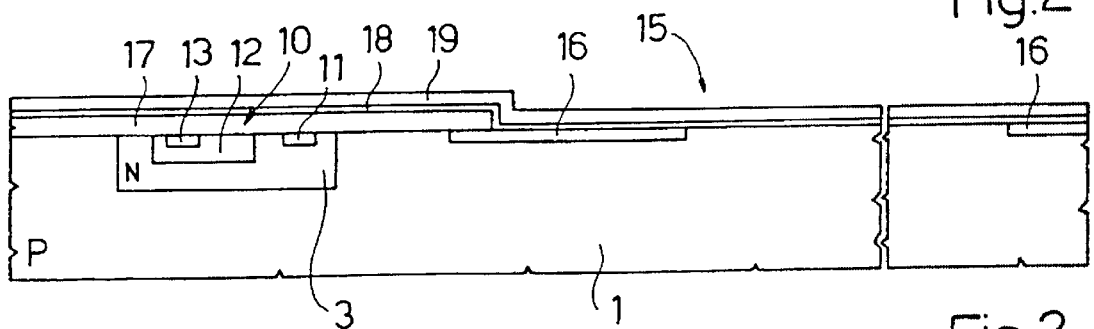
Figure 4:
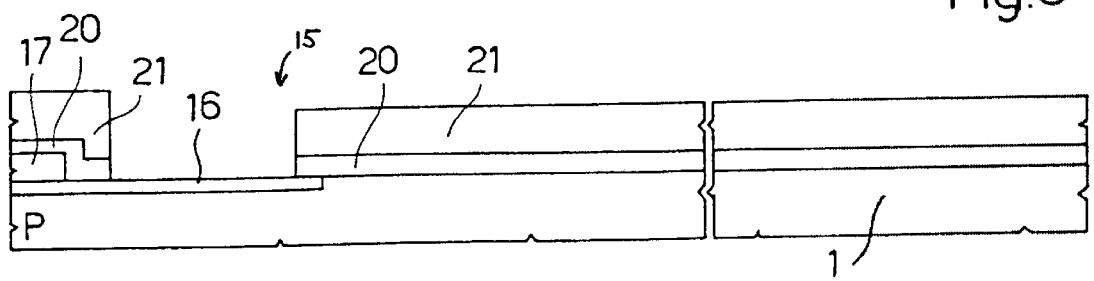
Figure 5:
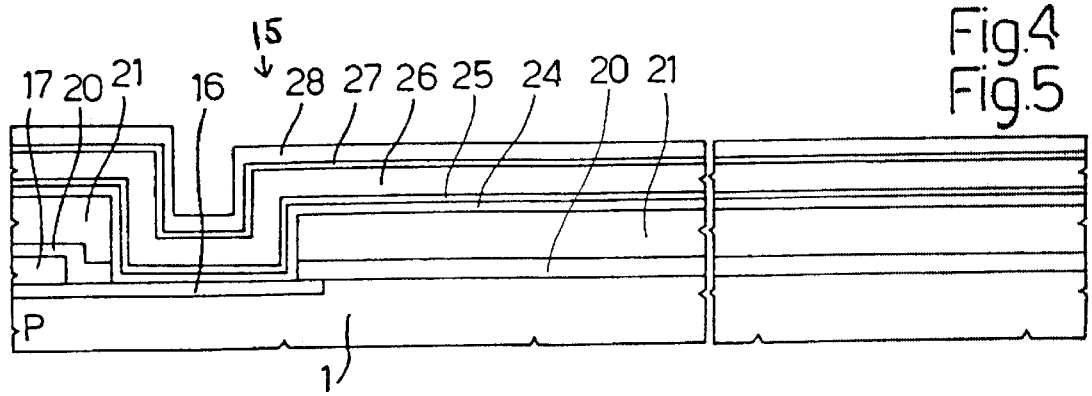

Then, as shown in FIG. 4, which is on a larger scale than FIGS. 1–3 and displaced so as to show the sensor zone 15 only, a sacrificial layer 21 of silicon oxide of approximately 2 μm thickness is deposited on the double layer 20 formed by the silicon oxide 18 and silicon nitride 19 layers. The sacrificial layer 21 is removed, together with the double layer 20 beneath, at the connection regions 16 where anchorages for the movable mass are to be formed (FIG. 4). There are then deposited, in succession, a thin polycrystal silicon layer 24 (approximately 0.35 μm thick for example); a first adhesive layer 25 (of titanium nitride for example), to facilitate the adhesion of the next layer to the layer 24; a tungsten layer 26 (1 μm thick for example); a second adhesive layer 27 (of titanium nitride for example); and then a first silicon carbide layer 28 (0.2 μm for example), thus obtaining the structure of FIG. 5. In the zones where the sacrificial layer 21 has been removed (above the connection regions 16) the layers 24, 26 and 28 thus form anchorages 41 for the seismic mass.

Figure 6:
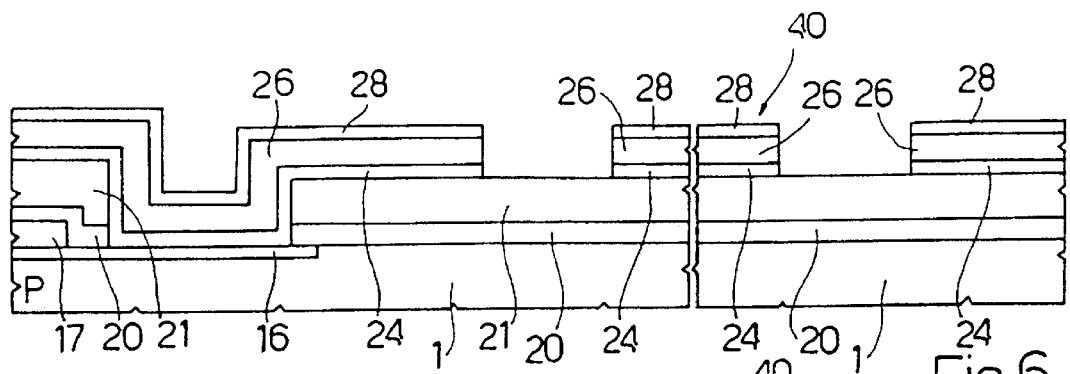
Figure 7:
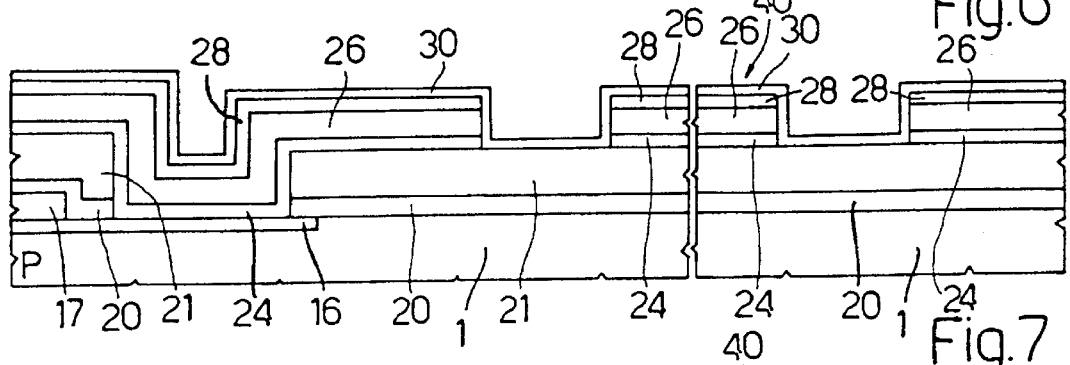
Figure 8:
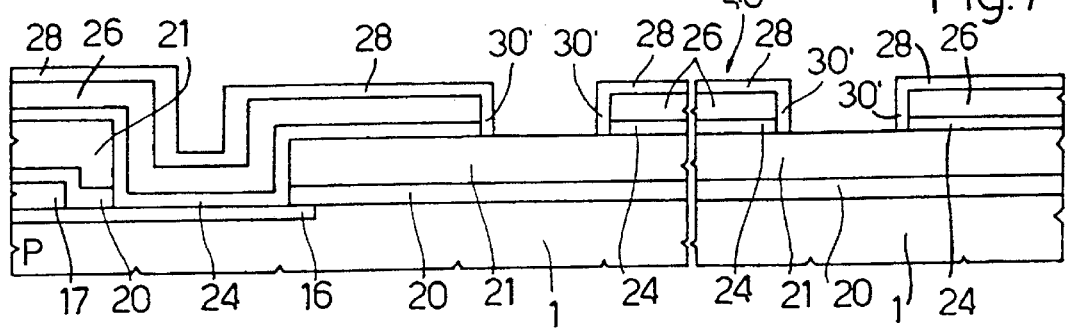

The suspended micro-structure 40 is then defined, by masking and anisotropic etching the first carbide layer 28, the tungsten layer 26 and the polycrystal silicon layer 24 as far as the sacrificial layer 21, thus obtaining the structure of FIG. 6, in which (as in the subsequent ones) the adhesive layers 25 and 27 are not shown, for greater clarity. Then, shown in FIG. 7, a second silicon carbide layer 30 is deposited, approximately 0.2 μm thick, which covers and forms a single layer with the first silicon carbide layer 28 when this is present, even though, in FIG. 7, the layers 28 and 30 have been shown separately for reasons of representation. A step of anisotropic etching of the carbide is then carried out so as completely to remove the portions of the layer 30 in direct contact with the sacrificial layer 21 and leaving the portions which cover the uncovered ends of the tungsten layer 26, so as to form "spacers" of silicon carbide denoted by 30' in FIG. 8.

Figure 9:
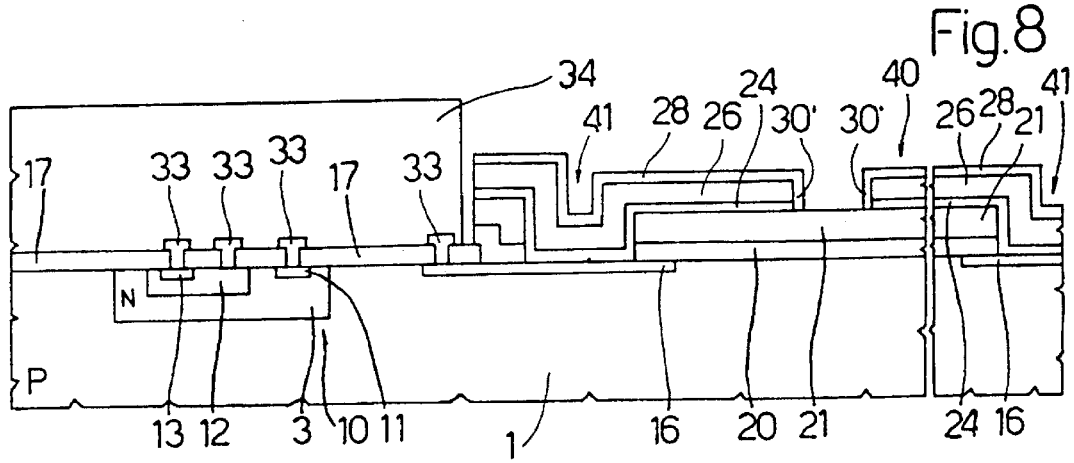

The sacrificial layer 21 and the double layer 20 are then removed from the zone of the circuitry. The structure is then masked to form the openings of the contacts of the circuitry and of the sensitive element through the layer 17. A metallic layer is deposited and defined to form the contacts 33 (visible in FIG. 9 which relates to a section similar to those of FIGS. 1–3, also showing part of the control circuit) and the metallic interconnections. A dielectric material passivation layer 34 is deposited and then removed in the zone of the contact pad (to permit the electrical contacting of the device) and in the sensor zone 15, thus obtaining the structure of FIG. 9.

Figure 10:
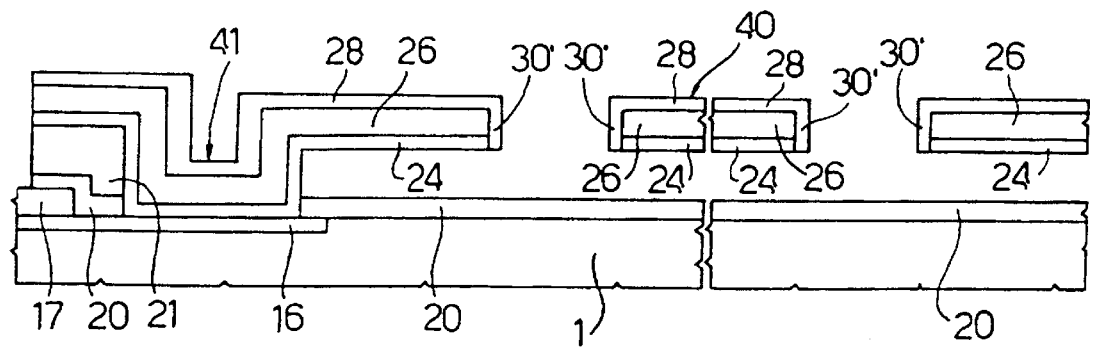
Figure 11:
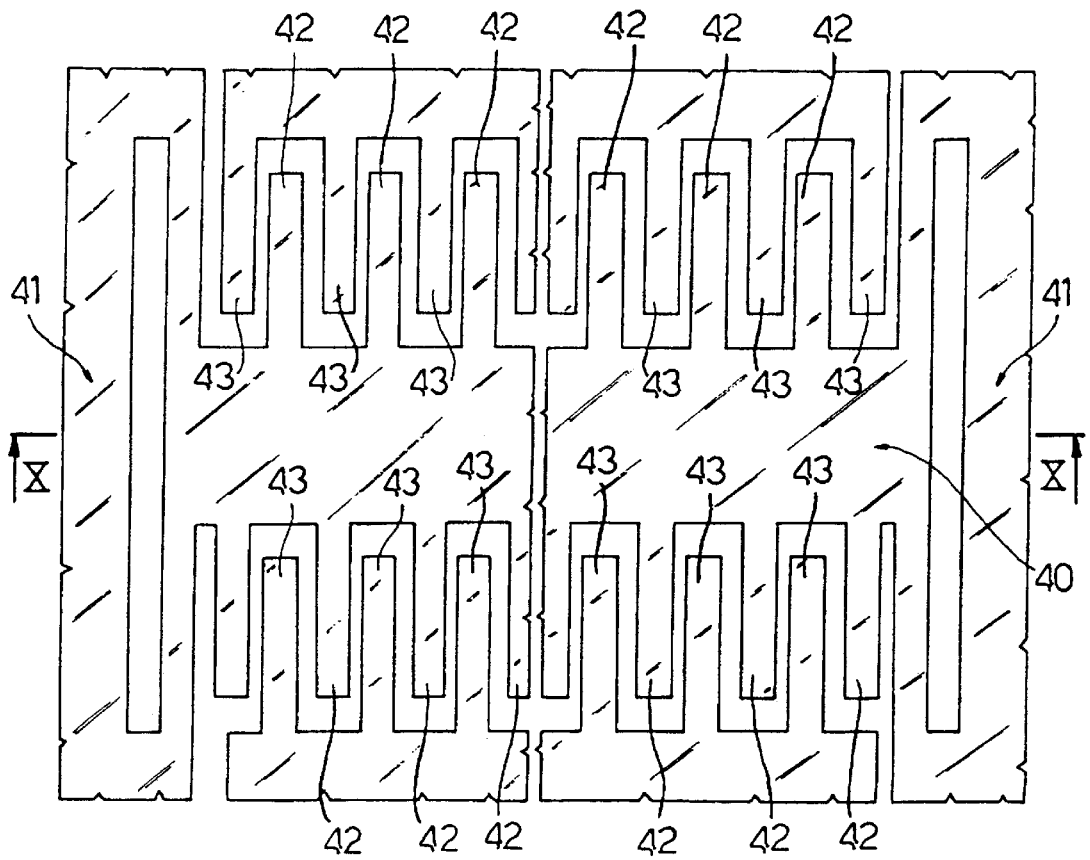
FIG. 11 shows a top view of the sensor obtained through the present process.

Then, by a suitable mask, the sacrificial layer 21 is removed in, for example, hydrofluoric acid in the sensor zone 15 while the polysilicon dielectric layer 24 underneath, the carbide layer 28 on the top and the spacers 30' at the sides protect the tungsten layer 26 from the etching. A suspended structure 40 (FIG. 10) is thus obtained, the external profile of which is shown in FIG. 11 and which is anchored to the wafer 1 by means of the anchorage regions 41. In particular, shown in FIG. 11, the suspended structure 40 is H-shaped with a plurality of transverse walls 42 defining the movable electrodes of the capacitive sensor which are interleaved in a comb-like manner with respective fixed transverse walls 43, defining the fixed electrodes. The structure is therefore equivalent to a capacitor formed by two capacitors in series, each formed by a plurality of elementary capacitors connected in parallel.

In a known manner the movable electrodes 42 and the fixed electrodes 43 are biased at different voltages so that when the suspended structure 40 is subjected to an acceleration the consequent change of distance between the movable electrodes and the fixed ones may be detected as a variation of capacitance.

The manufacture of the suspended mass of semiconductor material with a tungsten core, as described, gives the sensor high sensitivity. In fact, tungsten has high density (19.3 μg/cm$^3$) with respect to polycrystal or amorphous silicon (2.33 g/cm$^3$). Consequently, a tungsten layer 1 μm thick is virtually equivalent, from the point of view of the mechanical properties, to a 10 μm polysilicon layer. On the other hand, the deposition by CVD of a tungsten of the thickness quoted does not have the disadvantages which a silicon layer ten times thicker does have.

The sensor obtained in this way thus has high sensitivity and yet benefits from the advantages typical of "surface micromachining" technology.

In particular, the manufacturing process is simple to implement, using steps typical of microelectronics, is readily controllable and repeatable as well as economical. In fact, despite the need to deposit several layers as well as adhesion layers, a single mask is sufficient to form the suspended structure.

Finally it will be clear that numerous modifications and variants may be introduced to the process and sensor described and illustrated herein, all coming within the scope of the inventive concept as defined in the accompanying claims. In particular, the process can also be applied to sensors of a different type operating according to the capacitive or resonant principle of operation; the components of the circuitry integrated with the sensor may be both bipolar and MOS; the conductivity of the conductive regions may be the opposite of that shown and the protective and/or adhesive materials may be replaced by others which are equivalent as regards the functions desired.

What is claimed is:

1. A process for manufacturing integrated sensors, particularly accelerometers and gyroscopes, comprising the steps of forming a temporary support region of sacrificial material over a semiconductor material body and a suspended structure including a tungsten region over said temporary support region and then removing said temporary support region, wherein said step of forming a suspended structure comprises the steps of:

depositing a polycrystalline silicon layer over said temporary support region;

depositing a tungsten layer over said polycrystalline silicon layer;

depositing a first silicon carbide layer over said tungsten layer;

defining said suspended structure by selectively removing said silicon carbide, tungsten and polycrystalline silicon layers; and forming spacer elements of silicon carbide laterally with respect to uncovered ends of said tungsten layer.

2. The process according to claim 1 wherein said sacrificial material comprises deposited silicon oxide.

3. The process according to claim 1 wherein said step of forming spacer elements comprises the steps of depositing a second silicon carbide layer over and laterally with respect to said suspended structure and etching said second silicon carbide layer anisotropically.

4. The process according to claim 1 wherein a first and, respectively, a second adhesive layer are deposited before depositing the polycrystalline silicon layer and before depositing the first silicon carbide layer.

5. The process according to claim 1 wherein a step of forming electrical connection regions inside said semiconductor material body is carried out before said step of forming a support region; wherein said step of forming a support region comprises the step of depositing a sacrificial layer and wherein a step of selectively removing portions of said sacrificial layer at said electrical connection regions is carried out before depositing the polycrystalline silicon layer.

6. The process according to claim 5 wherein a step of depositing a silicon nitride layer is carried out before said step of depositing the sacrificial layer; wherein said sacrificial layer is of silicon oxide, and wherein a step of selectively removing said silicon nitride layer at said electrical connection regions is carried out after said step of selectively removing portions of said sacrificial layer.

7. A method for producing a sensor, comprising:

forming a sacrificial support layer on a semiconductor substrate;

forming a suspended structure on the sacrificial support layer, the suspended structure having a tungsten region and coupled by at least one anchorage region to the semiconductor substrate; and removing the sacrificial layer, wherein the step of forming a suspended structure layer comprises:

forming a polysilicon layer over the sacrificial support layer;

forming a tungsten layer over the polysilicon layer;

forming a protection layer over the tungsten layer;

selectively removing portions of the protective, tungsten and polysilicon layers to form a desired pattern; and covering exposed portions of the tungsten layer with spacer elements.

8. The method of claim 7 wherein the step of covering exposed portions of the tungsten layer comprises:

forming a second protective layer over and lateral to the suspended structure; and anisotropically etching portions of the second protective layer.

9. A method for producing a sensor, comprising:

forming a sacrificial support layer on a semiconductor substrate;

forming a suspended structure on the sacrificial support layer, the suspended structure having a tungsten region and coupled by at least one anchorage region to the semiconductor substrate; and removing the sacrificial layer, forming a first adhesive layer on the sacrificial support layer before forming the polysilicon layer; and forming a second adhesive layer on the tungsten layer before forming the protective layer.

* * * * *